(12) United States Patent
Katayama

(10) Patent No.: US 10,773,994 B2
(45) Date of Patent: Sep. 15, 2020

(54) PLATE GLASS AND METHOD FOR PRODUCING SAME

(71) Applicant: Nippon Electric Glass Co., Ltd., Shiga (JP)

(72) Inventor: Hiroki Katayama, Shiga (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 1 day.

(21) Appl. No.: 16/064,041

(22) PCT Filed: Dec. 2, 2016

(86) PCT No.: PCT/JP2016/085974
§ 371 (c)(1),
(2) Date: Jun. 20, 2018

(87) PCT Pub. No.: WO2017/149877
PCT Pub. Date: Sep. 8, 2017

(65) Prior Publication Data
US 2018/0370849 A1    Dec. 27, 2018

(30) Foreign Application Priority Data

Mar. 2, 2016  (JP) .................................. 2016-040101

(51) Int. Cl.
*C03C 15/02*    (2006.01)
*H01L 21/67*    (2006.01)
(Continued)

(52) U.S. Cl.
CPC ............. *C03C 15/02* (2013.01); *H01L 21/02* (2013.01); *H01L 21/02002* (2013.01);
(Continued)

(58) Field of Classification Search
CPC ............. C03C 15/02; H01L 21/02002; H01L 21/67092; H01L 21/67303;
(Continued)

(56) References Cited

U.S. PATENT DOCUMENTS 5,196,088 A * 3/1993 Soda ..................... C03C 15/00
216/36
7,629,089 B2 * 12/2009 Ito ........................ B82Y 10/00
428/428

(Continued)

FOREIGN PATENT DOCUMENTS

DE         4134356 A1 *  4/1993 ............ C03C 15/00
JP      2001-150311         6/2001
(Continued)

OTHER PUBLICATIONS

International Preliminary Report on Patentability dated Sep. 4, 2018 in International Application No. PCT/JP2016/085974.
(Continued)

*Primary Examiner* — Anita K Alanko
(74) *Attorney, Agent, or Firm* — Wenderoth, Lind & Ponack, L.L.P.

(57) ABSTRACT

Provided is a method of manufacturing a glass sheet (G) having a disc shape including a cutout portion (Gb) in a peripheral edge portion (Ga), the method including etching the cutout portion (Gb).

5 Claims, 12 Drawing Sheets

(51) Int. Cl.
*H01L 21/673* (2006.01)
*H01L 21/02* (2006.01)
*H01L 21/683* (2006.01)
*B24B 41/053* (2006.01)

(52) U.S. Cl.
CPC .. *H01L 21/67086* (2013.01); *H01L 21/67092* (2013.01); *H01L 21/67303* (2013.01); *H01L 21/683* (2013.01); *B24B 41/053* (2013.01)

(58) Field of Classification Search
CPC . H01L 21/67086; H01L 21/683; H01L 21/02; B24B 41/053
See application file for complete search history.

(56) References Cited

U.S. PATENT DOCUMENTS

| | | | |
|---|---|---|---|
| 10,442,729 B2 * | 10/2019 | Katayama | H01L 21/568 |
| 2008/0128088 A1 | 6/2008 | Junn et al. | |
| 2011/0003619 A1 * | 1/2011 | Fujii | C03C 3/083 455/566 |
| 2011/0265517 A1 * | 11/2011 | Keebler | B24B 9/10 65/30.13 |
| 2012/0052302 A1 * | 3/2012 | Matusick | C03C 15/00 428/410 |
| 2012/0083401 A1 * | 4/2012 | Koyama | C03C 3/085 501/70 |
| 2012/0103937 A1 | 5/2012 | Haneda | |
| 2013/0273810 A1 * | 10/2013 | Hsu | B24B 9/10 451/5 |
| 2017/0183259 A1 * | 6/2017 | Da | C03C 15/02 |
| 2017/0233650 A1 * | 8/2017 | Lu | C03C 15/00 252/79.3 |
| 2018/0001434 A1 * | 1/2018 | Shafrir | C03B 17/02 |

FOREIGN PATENT DOCUMENTS

| | | |
|---|---|---|
| JP | 2005-118903 | 5/2005 |
| JP | 2010-003365 | 1/2010 |
| JP | 2012-099172 | 5/2012 |
| TW | 200832541 | 8/2008 |
| WO | 2013/137329 | 9/2013 |
| WO | 2016/189945 | 12/2016 |

OTHER PUBLICATIONS

Office Action dated Oct. 15, 2018 in corresponding Taiwanese patent application No. 105142273, with an English translation of Search Report.
International Search Report dated Feb. 28, 2017 in International Application No. PCT/JP2016/085974.

* cited by examiner

PLATE GLASS AND METHOD FOR PRODUCING SAME

TECHNICAL FIELD

The present invention relates to a glass sheet comprising a cutout portion in a peripheral edge portion, and a method of manufacturing the glass sheet.

BACKGROUND ART

For example, during a manufacturing process of a semiconductor wafer, a glass sheet is used as a member for supporting the semiconductor wafer in some cases. In this case, the semiconductor wafer includes a cutout portion called "notch" so that a crystal orientation of the semiconductor wafer is aligned with a predetermined direction, and the cutout portion is typically subjected to polishing.

For example, in Patent Literature 1, there is disclosed a method of subjecting a cutout portion of a semiconductor wafer to polishing. The polishing method involves pressing a disc-shaped polishing tool formed of a nonwoven fabric or the like against the cutout portion of the semiconductor wafer to be polished while rotating the polishing tool, to thereby polish the cutout portion into a shape corresponding to a substantially V-shaped outer peripheral portion of the polishing tool (paragraph [0027], FIG. 2 to FIG. 4).

CITATION LIST

Patent Literature 1: JP 2005-118903 A

SUMMARY OF INVENTION

Technical Problem

When a glass sheet is used for supporting a semiconductor wafer, it is required to form a cutout portion for alignment also in the glass sheet. Glass is generally brittle, and hence there is a risk in that the glass sheet is fractured from the cutout portion when the glass sheet for supporting is used in a semiconductor manufacturing step. Therefore, in order to improve strength of the glass sheet, it is conceivable to subject also the cutout portion of the glass sheet to polishing. However, the surface of the cutout portion cannot be formed into a sufficiently smooth state by polishing using a polishing tool, and sufficient strength required for the glass sheet for supporting cannot be obtained in some cases. That is, when the glass sheet for supporting is used in a related-art semiconductor manufacturing step, there is a risk in that the glass sheet is fractured.

Further, when the cutout portion of the glass sheet has an angular portion, cracking is liable to occur, and hence it is also conceivable to form the angular portion into, for example, a smooth curved surface shape such as a round surface. However, in this case, a three-dimensional shape of the cutout portion becomes more complicated, and hence it is difficult to completely polish the surface of the cutout portion with the polishing tool having such a form as disclosed in Patent Literature 1.

The present invention has been made in view of the above-mentioned circumstances, and a technical object to be achieved by the present invention is to improve strength of a glass sheet by completely subjecting a cutout portion formed in the glass sheet to stable processing.

Solution to Problem

The present invention has been made in order to solve the above-mentioned problem. According to one embodiment of the present invention, there is provided a method of manufacturing a glass sheet having a disc shape comprising a cutout portion in a peripheral edge portion, the method comprising etching the cutout portion. As described above, when the cutout portion is subjected to etching, the entire surface of the cutout portion can be completely smoothed. Thus, the strength of the glass sheet can be improved. Further, the cutout portion can be completely and stably subjected to processing.

According to one embodiment of the present invention, in the method of manufacturing a glass sheet, it is desired that the etching the cutout portions is performed while a plurality of the glass sheets are laminated with positions of the cutout portions being aligned with each other. As described above, when the plurality of glass sheets are laminated under a state in which the positions of the cutout portions are aligned with each other, each of the cutout portions can be continuously or simultaneously subjected to etching, and glass sheets can be efficiently manufactured.

According to one embodiment of the present invention, in the method of manufacturing a glass sheet, it is desired that the positions of the cutout portions of the plurality of glass sheets be aligned through use of positioning members. With this, when the positioning members are brought into contact with the plurality of cutout portions, the positions of the cutout portions of the plurality of glass sheets can be accurately aligned with each other.

According to one embodiment of the present invention, in the method of manufacturing a glass sheet, it is desired that the positioning members be removably and movably mounted on a stacking base on which the plurality of glass sheets are to be stacked. As described above, when the positioning members are mounted on the stacking base, the cutout portions can be efficiently positioned at a fixed position. When this positioning is finished, the positioning members are removed from the stacking base or changed in position to be separated from the cutout portions. Thus, the cutout portions can be subjected to satisfactory etching under a state in which the positioning member does not become an obstacle.

According to one embodiment of the present invention, in the method of manufacturing a glass sheet, it is desired that the stacking base have a support surface on which the plurality of glass sheets are to be stacked, and that the support surface be arranged in an inclined state with respect to a horizontal direction. As described above, when the support surface of the stacking base is arranged in an inclined state, the glass sheets can be easily stacked on the support surface, and a lamination operation of the glass sheets with respect to the support surface can be efficiently performed.

According to one embodiment of the present invention, in the method of manufacturing a glass sheet, it is desired that a protective layer be formed between the plurality of glass sheets. As described above, when the protective layer is formed between the glass sheets, the surface of each of the glass sheets can be prevented from being corroded with an etchant.

Further, it is desired that the protective layer be formed of a liquid. When the protective layer is formed of a liquid, the protective layer can be rapidly formed. Further, when etching is finished, the laminated glass sheets can be easily peeled.

According to one embodiment of the present invention, in the method of manufacturing a glass sheet, the cutout portions of the plurality of glass sheets and the peripheral edge portions of the plurality of glass sheets excluding the cutout portions be subjected to etching. As described above, when not only the cutout portions of the glass sheets but also the peripheral edge portions thereof are subjected to etching, the entire strength of the glass sheet can be improved.

According to one embodiment of the present invention, there is provided a glass sheet having a disc shape comprising a cutout portion in a peripheral edge portion, wherein the glass sheet has a main surface formed of a non-etched surface, and wherein the cutout portion is formed of an etched surface. With the above-mentioned configuration, for example, when the glass sheet is used for supporting a semiconductor, fracture of the glass sheet in a semiconductor manufacturing step can be suppressed.

Advantageous Effects of Invention

According to the present invention, the strength of the glass sheet can be improved by completely subjecting the cutout portion formed in the glass sheet to stable processing.

DESCRIPTION OF EMBODIMENTS

Now, modes for carrying out the present invention are described with reference to the drawings. FIG. 1 to FIG. 13 are views for illustrating a method of manufacturing a glass sheet according to one embodiment of the present invention.

Figure 1:
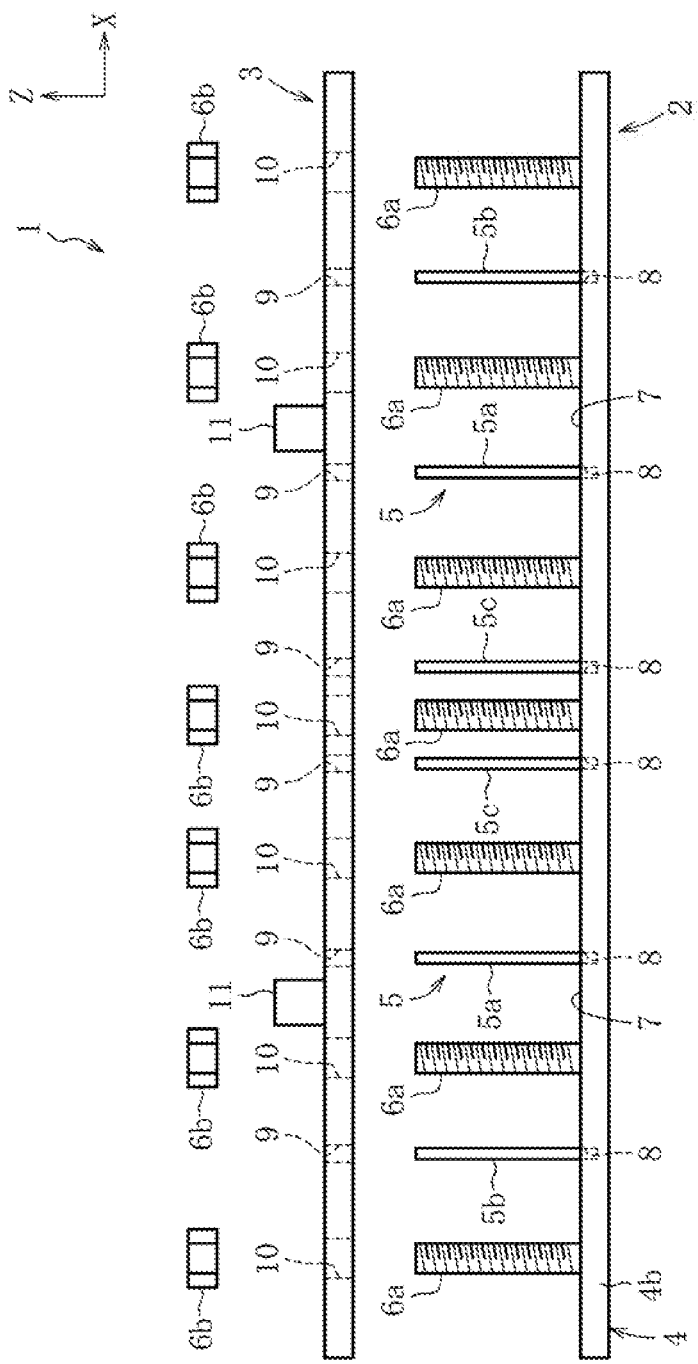
FIG. 1 is an exploded side view of a holder to be used in a method of manufacturing a glass sheet.
Figure 2:
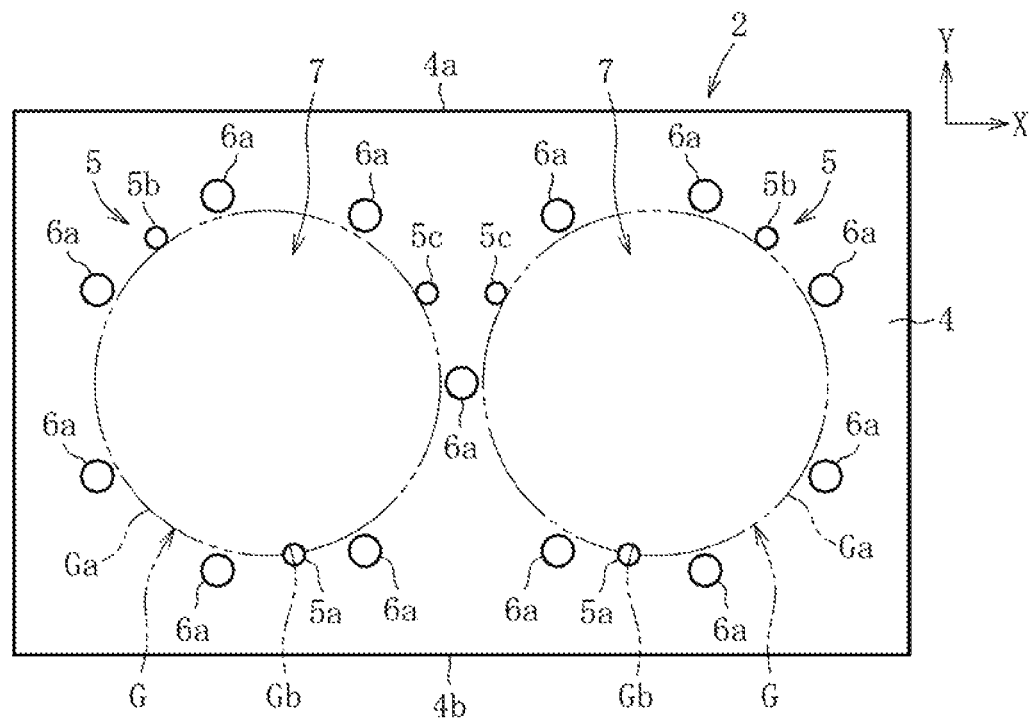
FIG. 2 is a plan view for illustrating a first member of the holder.

FIG. 1 is a view for illustrating a holder of a glass sheet to be used for carrying out the method of the present invention. A holder 1 comprises a first member 2 and a second member 3. A plurality of glass sheets G are stacked on the first member 2. The second member 3 is overlaid on the first member 2 receiving the plurality of glass sheets G. As illustrated in FIG. 2, each of the glass sheets G is formed into a disc shape and comprises a cutout portion Gb called "notch" in a part of a peripheral edge portion Ga.

As illustrated in FIG. 1 and FIG. 2, the first member 2 comprises a main body portion 4, positioning portions 5, and coupling portions 6. The glass sheets G are stacked on the main body portion 4. The positioning portions 5 are configured to position the glass sheets G that are stacked on the main body portion 4. The coupling portions 6 are configured to couple the first member 2 and the second member 3 to each other.

The main body portion 4 is formed of a rectangular plate member. The main body portion 4 has a support surface 7 on which the glass sheets G are to be stacked. The support surface 7 is formed into a rectangular shape so as to support the glass sheets G laminated in two rows. Further, the support surface 7 comprises a plurality of (three in this example) holes 8 for removably supporting each of the positioning portions 5.

Each of the positioning portions 5 comprises a plurality of positioning pins 5a to 5c that are removably mounted on the supporting surface 7 of the main body portion 4. In this embodiment, the three positioning pins 5a to 5c are used as one group, and a total of two groups of the positioning pins 5a to 5c are arranged on the supporting surface 7. One group of the positioning pins 5a to 5c comprises the first positioning pin 5a, the second positioning pin 5b, and the third positioning pin 5c. The first positioning pin 5a is configured to position the cutout portions Gb of the glass sheets G. The second positioning pin 5b and the third positioning pin 5c are configured to position the peripheral edge portions Ga of the glass sheets G. As illustrated in FIG. 1, each of the positioning pins 5a to 5c is arranged to stand with one end portion thereof being inserted into the hole 8 of the support surface 7.

As illustrated in FIG. 1, each of the coupling portions 6 comprises a plurality of bar-shaped members 6a protruding from the support surface 7 of the main body portion 4. Each of the bar-shaped members 6a is formed of a screw member and comprises a male thread portion across the full length thereof. Further, the coupling portion 6 comprises nuts 6b that are fitted on the male screw portions of the bar-shaped members 6a.

As illustrated in FIG. 2, the plurality of bar-shaped members 6a forming the coupling portion 6 are arranged annularly so as to surround the glass sheets G stacked on the support surface 7 of the main body portion 4. Specifically, the coupling portions 6 are arranged annularly in two regions of the support surface 7 of the main body portion 4 so as to correspond to the glass sheets G laminated in two rows. A diameter of the annular arrangement of the bar-shaped members 6a (diameter of a circle inscribed to the bar-shaped members 6a) is set to be larger than that of the glass sheet G. With this, when the glass sheets G are stacked on the first member 2, each of the bar-shaped members 6a is positioned away from the peripheral edge portions Ga of the glass sheets G and is not brought into contact with the peripheral edge portions Ga during etching described later.

Figure 3:
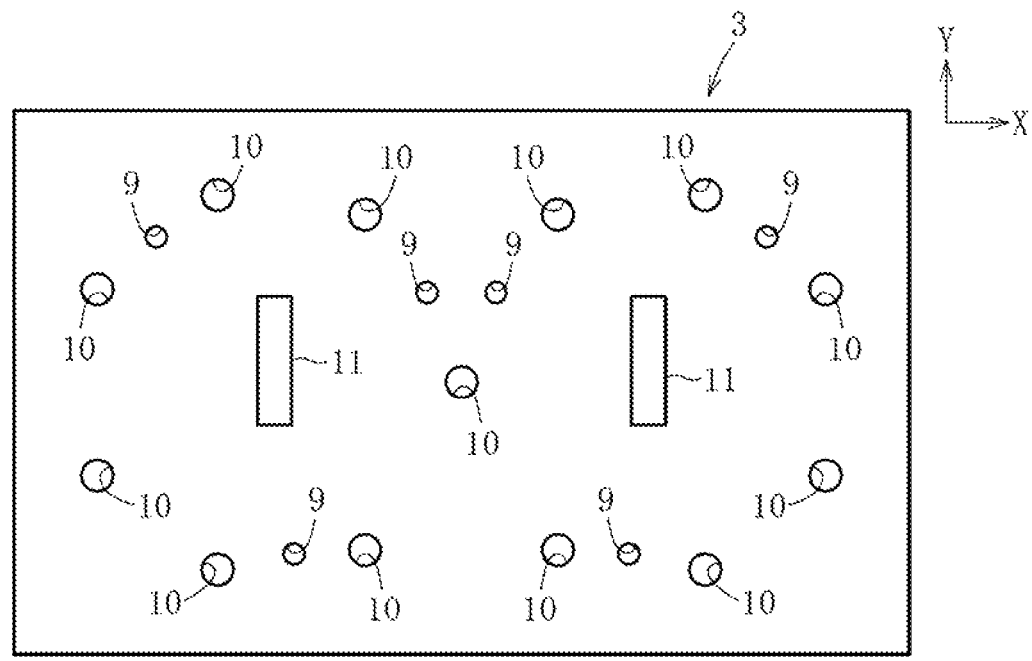
FIG. 3 is a plan view for illustrating a second member of the holder.

As illustrated in FIG. 3, the second member 3 is formed of a rectangular plate member similarly the first member 2. The second member 3 comprises first through holes 9 into which the respective positioning pins 5a to 5c of the positioning portion 5 can be inserted and second through holes 10 into which the respective bar-shaped members 6a of the coupling portion 6 can be inserted. Further, the second member 3 comprises gripping portions 11 for operating the holder 1.

Now, a method of manufacturing the glass sheet G through use of the holder 1 having the above-mentioned configuration is described.

The glass sheet G is obtained, for example, by the following method. Circular glass comprising the peripheral edge portion Ga is formed from base material glass by cutting and grinding, and then a part of the peripheral edge portion Ga is subjected to cutting and grinding to form the cutout portion Gb. The surface of the glass sheet G, the peripheral edge portion Ga, and the cutout portion Gb may be subjected to polishing through use of a polishing tool such as polishing stone or a polishing tape, before being subjected to etching described below.

After that, the glass sheet G is stacked on the support surface 7 of the first member 2. In this embodiment, the first member 2 is used as a stacking base on which the glass sheet G is to be laminated.

Figure 4:
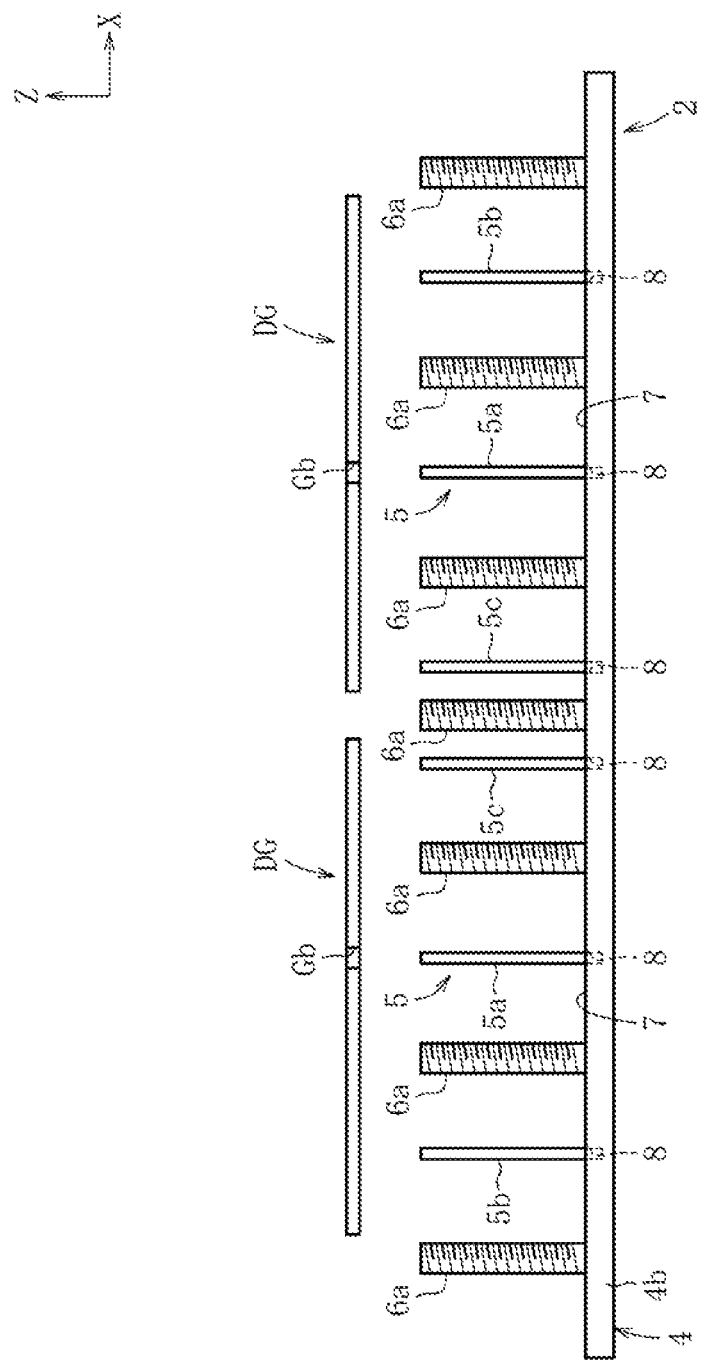
FIG. 4 is a side view for illustrating one step in the method of manufacturing a glass sheet.

Before the first glass sheet G is stacked on the support surface 7, a dummy glass DG is stacked on the support surface 7 (see FIG. 4). It is desired that the dummy glass DG have substantially the same shape as that of the glass sheet G. That is, the dummy glass DG comprises the cutout portion Gb in a peripheral edge portion thereof. When the dummy glass DG is stacked on the support surface 7, the plurality of glass sheets G are successively laminated on the dummy glass DG as illustrated in FIG. 5, FIG. 6, and FIG. 7A to FIG. 7C.

Figure 5:
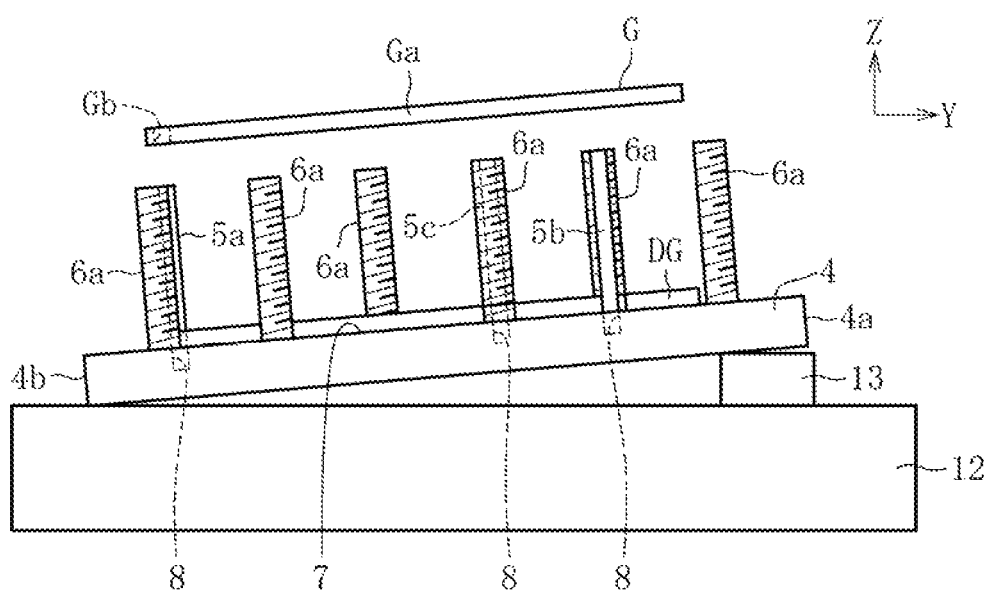
FIG. 5 is a side view for illustrating one step in the method of manufacturing a glass sheet.
Figure 6:
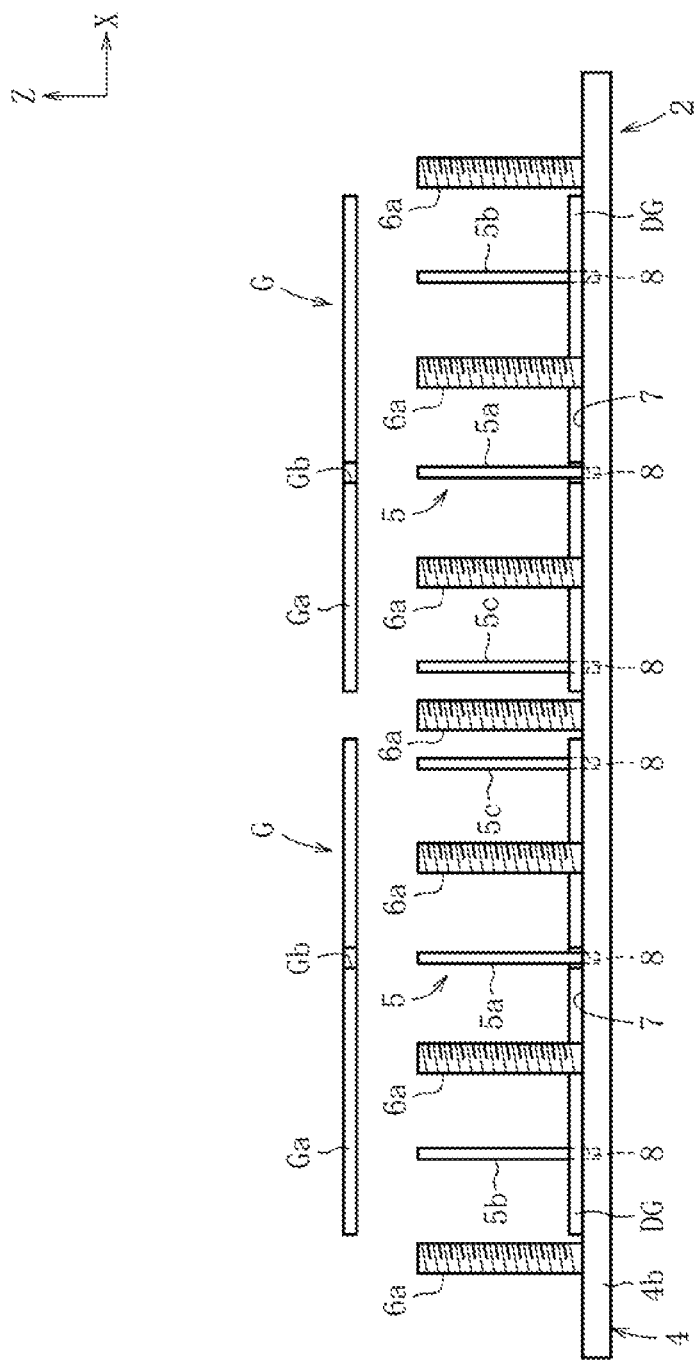
FIG. 6 is a side view for illustrating one step in the method of manufacturing a glass sheet.

As illustrated in FIG. 5, the first member 2 is stacked on a predetermined installation base 12. A spacer 13 is provided between the installation base 12 and the first member 2. The spacer 13 is configured to support a lower surface of one end portion 4a of the main body portion 4 in a transverse direction of the first member 2. With this, the support surface 7 of the main body portion 4 in the first member 2 is inclined so that the position of the one end portion 4a in the transverse direction is high, and the position of another end portion 4b is low. It is desired that the inclination angle of the support surface 7 with respect to the horizontal direction be 45° or less.

Figure 7A:
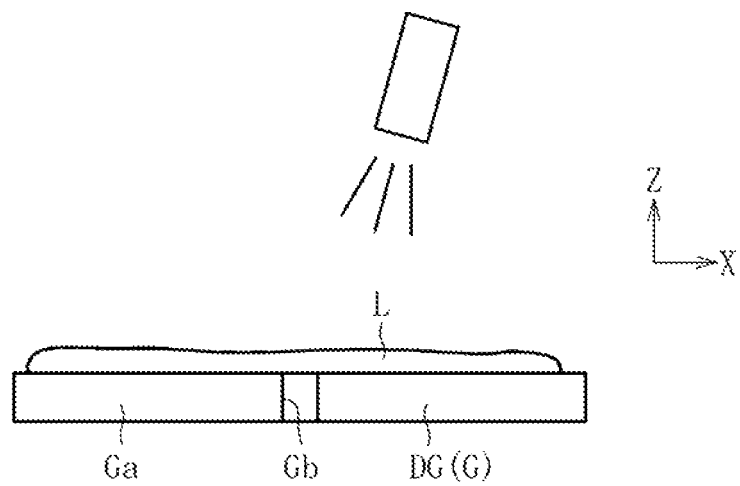
FIG. 7A is a side view for illustrating one step in the method of manufacturing a glass sheet.
Figure 7B:
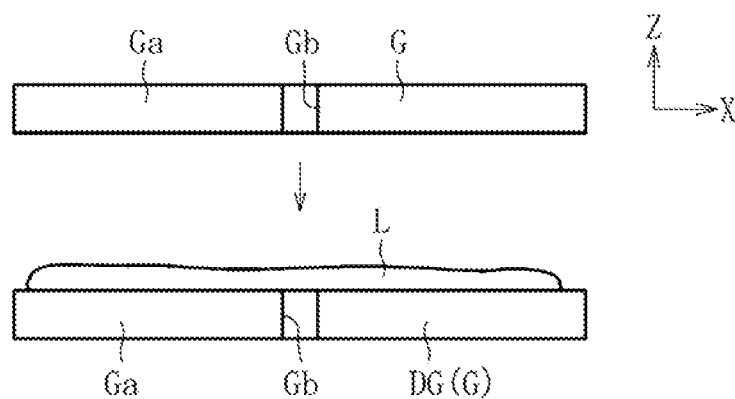
FIG. 7B is a side view for illustrating one step in the method of manufacturing a glass sheet.
Figure 7C:
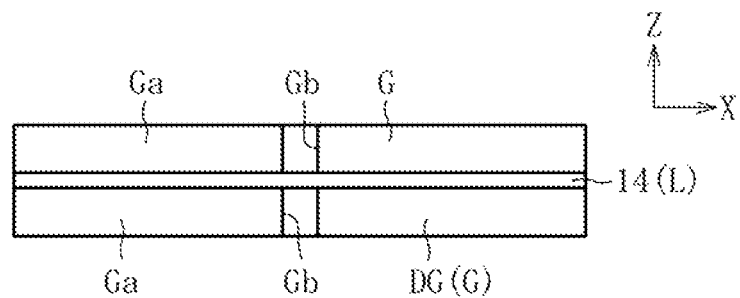
FIG. 7C is a side view for illustrating one step in the method of manufacturing a glass sheet.

After that, as illustrated in FIG. 7A, a predetermined liquid L (for example, water) is applied to the surface of the dummy glass DG. Then, as illustrated in FIG. 7B, the first glass sheet G is overlaid on the dummy glass DG. With this, as illustrated in FIG. 7C, a film of the liquid L is formed between the dummy glass DG and the glass sheet G. The film of the liquid L serves as a layer (protective layer 14) for preventing an etchant from entering between the dummy glass DG and the glass sheet G to protect the surface of the glass sheet G during etching described later.

Figure 8:
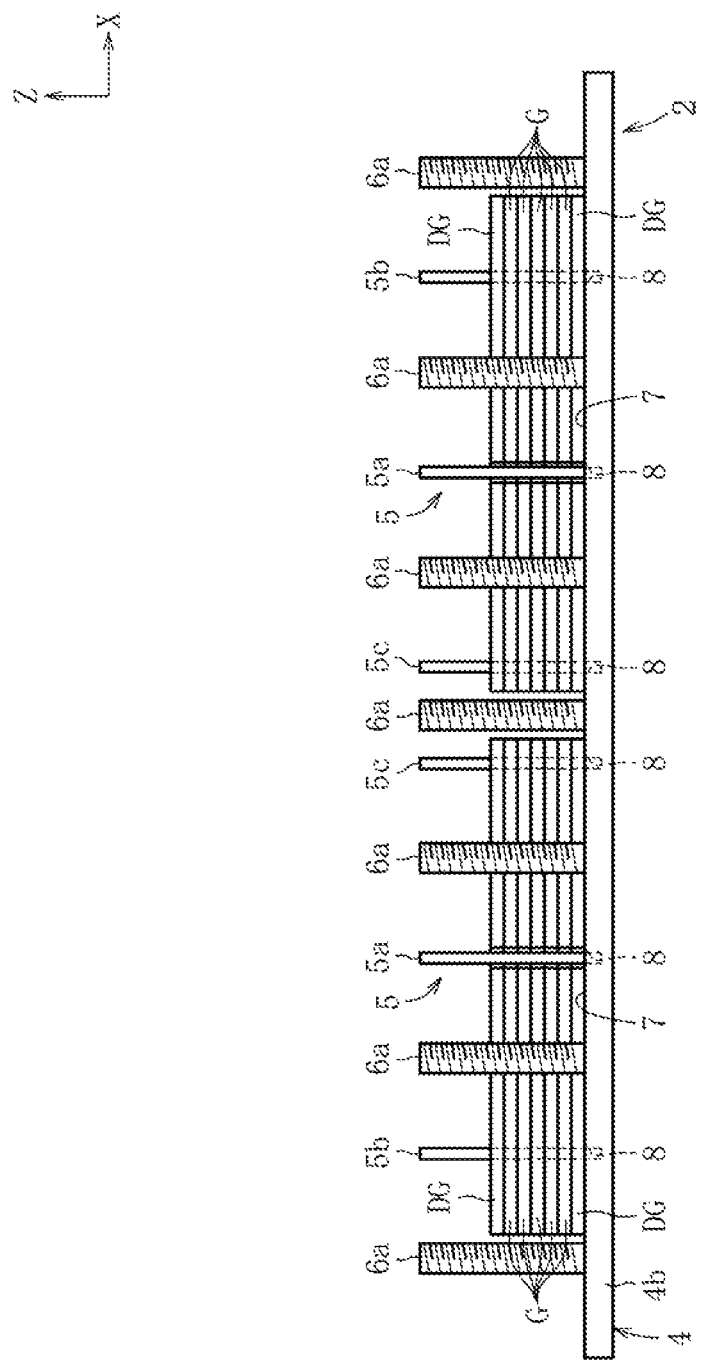
FIG. 8 is a side view for illustrating one step in the method of manufacturing a glass sheet.

When the glass sheet G is laminated, the protective layer 14 of the liquid L is formed also between the glass sheets G. As illustrated in FIG. 8, when a predetermined number (five in the illustrated example) of the glass sheets G are laminated, the dummy glass DG is laminated on the glass sheet G positioned in an uppermost portion. The protective layer 14 is formed also between the dummy glass DG and the glass sheet G positioned in the uppermost portion.

When the glass sheet G is laminated, the bar-shaped members 6a of the coupling portion 6 arranged annularly with respect to the support surface 7 of the main body portion 4 serve as marks, and an operator can easily set the glass sheet G by moving the glass sheet G to an inner side of annular arrangement in the coupling portion 6. Further, when the glass sheet G is stacked on the support surface 7, the glass sheet G may be brought into contact with the coupling portion 6 to be guided to a setting position through use of the coupling portion 6 as a guide.

The operator laminates the glass sheet G on the support surface 7 of the first member 2 while bringing the glass sheet G into abutment against the first positioning pin 5a, the second positioning pin 5b, and the third positioning pin 5c. Specifically, the operator brings the cutout portion Gb of the glass sheet G into contact with the first positioning pin 5a and brings the second positioning pin 5b and the third positioning pin 5c into contact with the peripheral edge portion Ga of the glass sheet G. With this, the plurality of glass sheets G laminated on the support surface 7 of the first member 2 are positioned under a state in which the positions of the cutout portions Gb are aligned with each other. As a result, the cutout portions Gb of the laminated glass sheets G are not displaced in position, and hence the surfaces of the glass sheets G are not exposed. It is preferred that the first positioning pin 5a be formed into a shape that corresponds to the shape of the cutout portion Gb and allows engagement with the cutout portion Gb. In this embodiment, the cutout portion Gb is formed into a round recessed shape in plan view, and hence the first positioning pin 5a is formed into a cylindrical shape having a diameter corresponding to the dimension of the cutout portion Gb.

The support surface 7 of the first member 2 is arranged in an inclined state through use of the spacer 13 set on the installation base 12 (see FIG. 5), and hence the support surface 7 is in such a posture that the glass sheet G can be easily stacked. That is, for example, when the operator stacks the glass sheet G on the support surface 7 from the another end portion 4b side in the transverse direction of the first member 2, the support surface 7 is arranged to be inclined to come close to the operator. Therefore, the lamination operation of the glass sheet G on the support surface 7 can be easily performed.

Further, each of the positioning pins 5a to 5c supported by the support surface 7 is inclined in accordance with the inclination of the support surface 7. In this case, when the operator stacks the glass sheet G on the support surface 7 from the another end portion 4b side in the transverse direction of the first member 2, each of the positioning pins 5a to 5c is inclined so that a distal end portion thereof is directed to the operator. Thus, when the operator stacks the glass sheet G on the support surface 7, the operator can easily bring the glass sheet G into contact with each of the positioning pins 5a to 5c and further easily perform the lamination operation of the glass sheets G.

Figure 9:
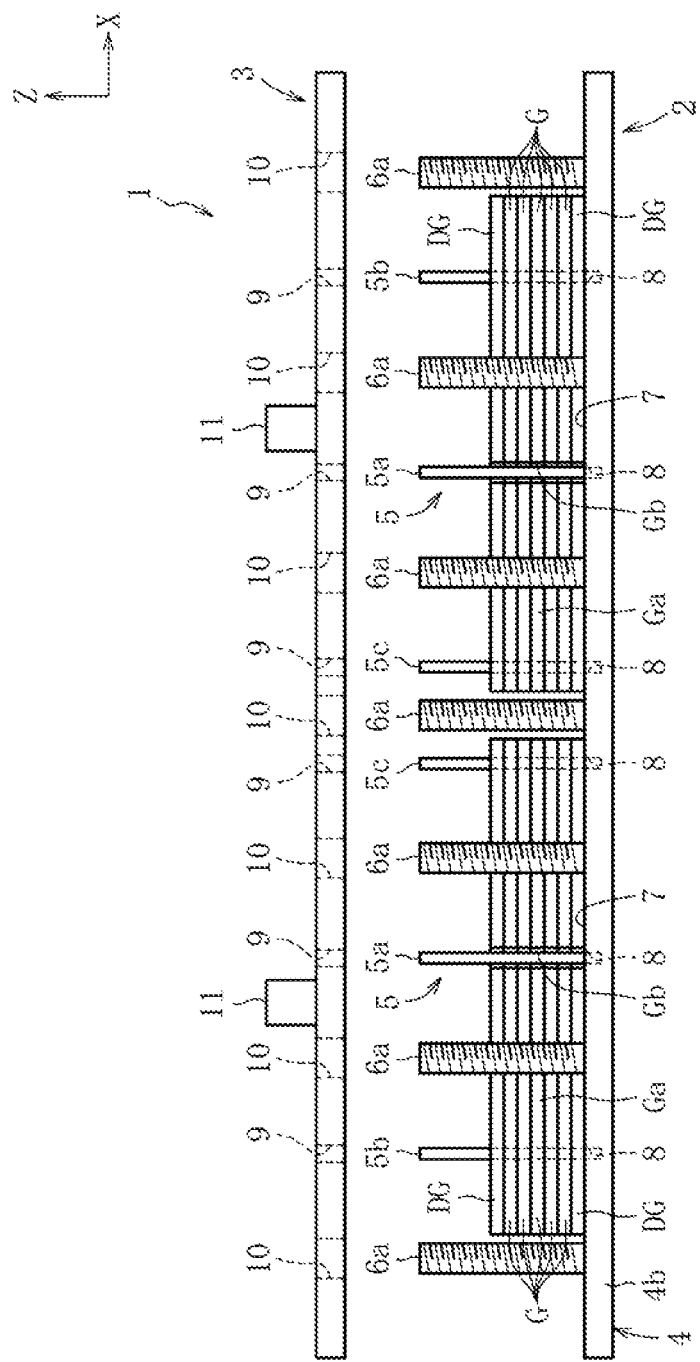
FIG. 9 is a side view for illustrating one step in the method of manufacturing a glass sheet.
Figure 10:
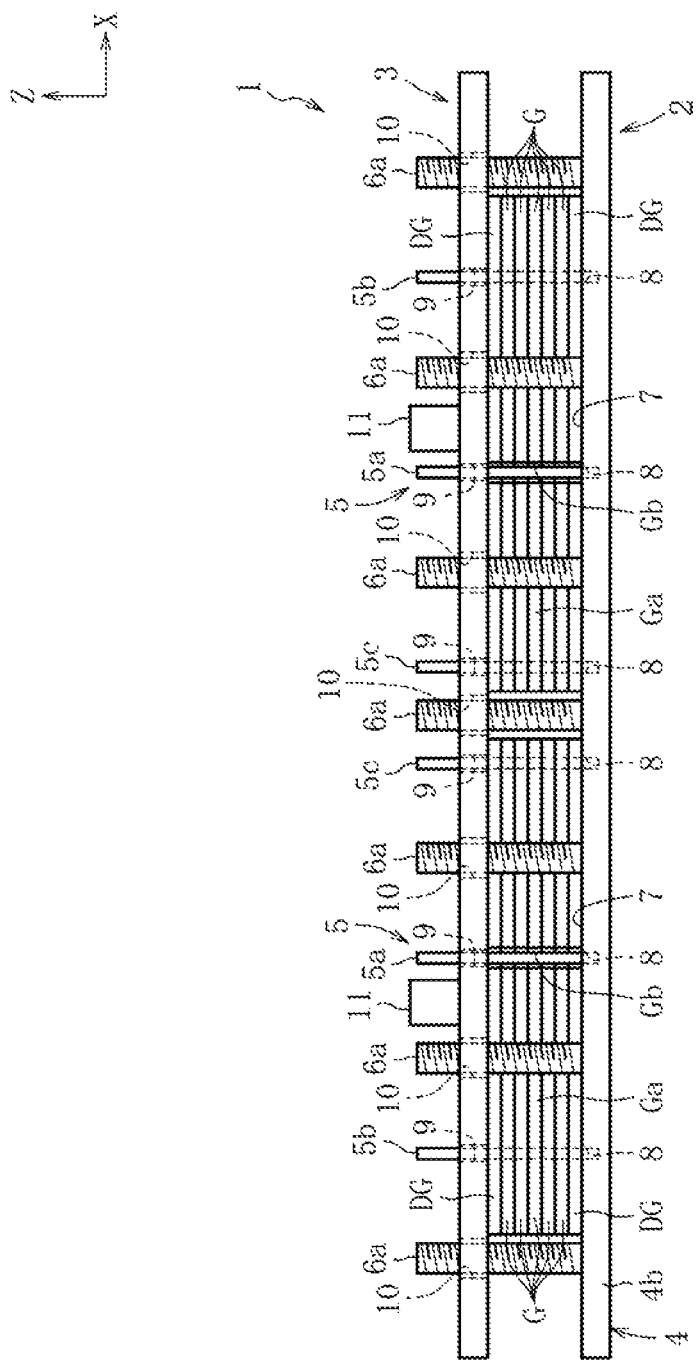
FIG. 10 is a side view for illustrating one step in the method of manufacturing a glass sheet.

After that, as illustrated in FIG. 9 and FIG. 10, the second member 3 is overlaid on the first member 2. The second member 3 is brought into contact with the dummy glass DG positioned in the uppermost portion of the laminated glass sheets G. Further, the distal ends of the positioning pins 5a to 5c of the first member 2 are inserted into the first through holes 9 of the second member 3, and distal end portions of the bar-shaped members 6a of the coupling portion 6 are inserted into the second through holes 10 of the second member 3 (see FIG. 10).

Figure 11:
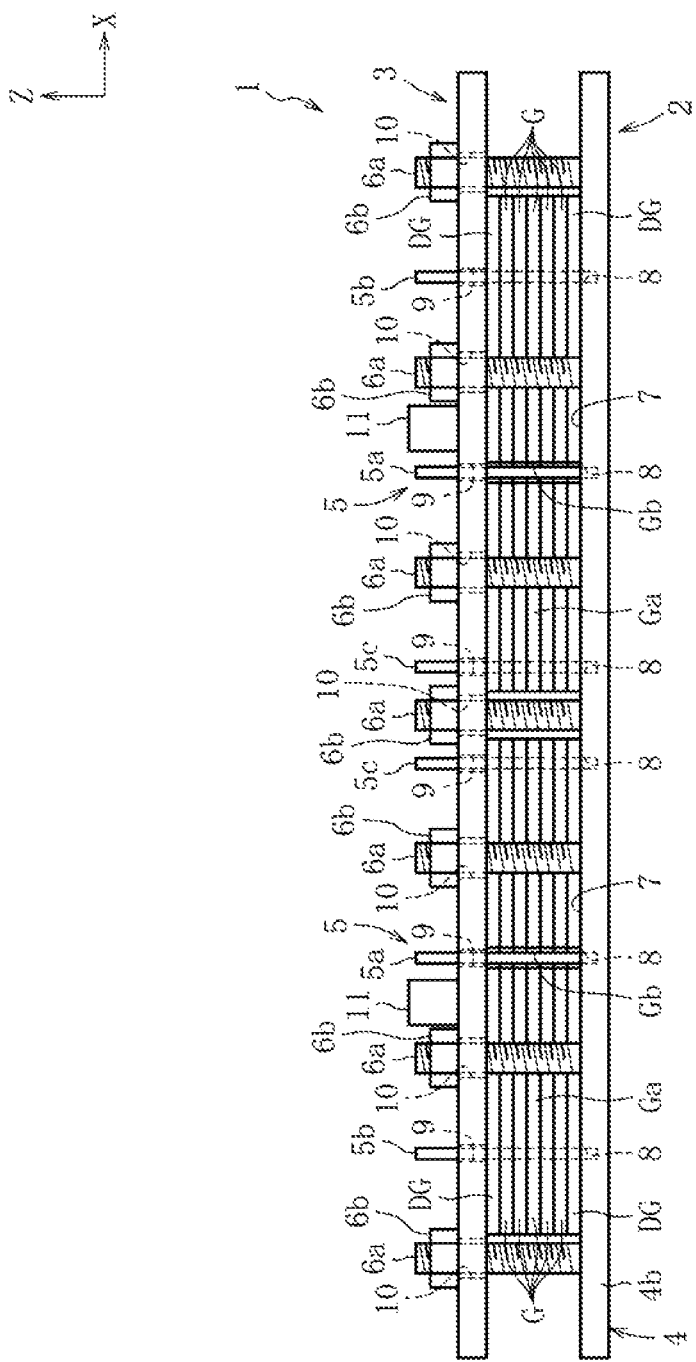
FIG. 11 is a side view for illustrating one step in the method of manufacturing a glass sheet.

When the second member 3 is set, the distal end portions of the positioning member 5 and the distal end portions of the bar-shaped members 6a of the coupling portion 6 protrude from the respective through holes 9 and 10 of the second member 3 as illustrated in FIG. 10. In this state, as illustrated in FIG. 11, the nuts 6b are fitted on the distal end portions of the bar-shaped members 6a.

Figure 12:
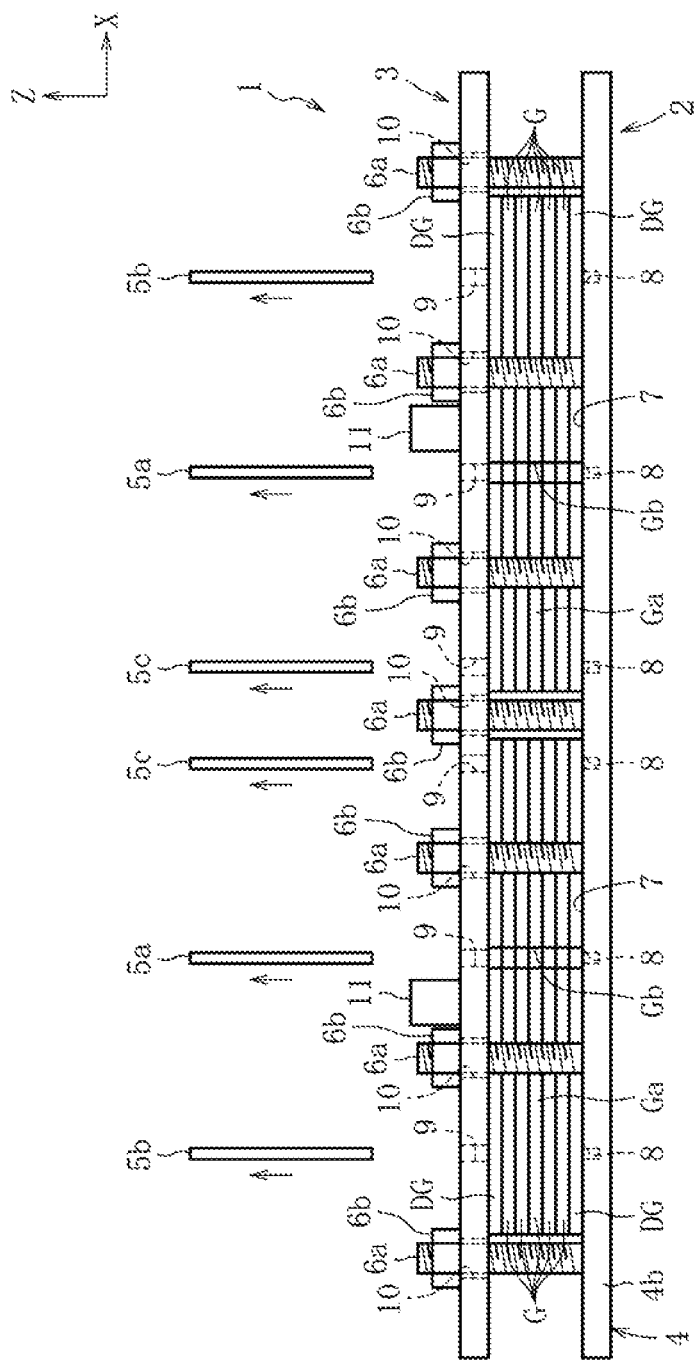
FIG. 12 is a side view for illustrating one step in the method of manufacturing a glass sheet.

When the nuts 6b are sufficiently fastened, the second member 3 is coupled to the first member 2 under a state in which the laminated glass sheets G are pressed with an appropriate force. When the coupling between the first member 2 and the second member 3 is completed as illustrated in FIG. 12, the first positioning pin 5a, the second positioning pin 5b, and the third positioning pin 5c are removed from the holder 1. In this case, one end portion of each of the positioning pins 5a to 5c protrudes from the first through hole 9 of the second member 3. Therefore, the operator can easily remove each of the positioning pins 5a to 5c from the holder 1 by holding and pulling out one end portion thereof.

Figure 13:
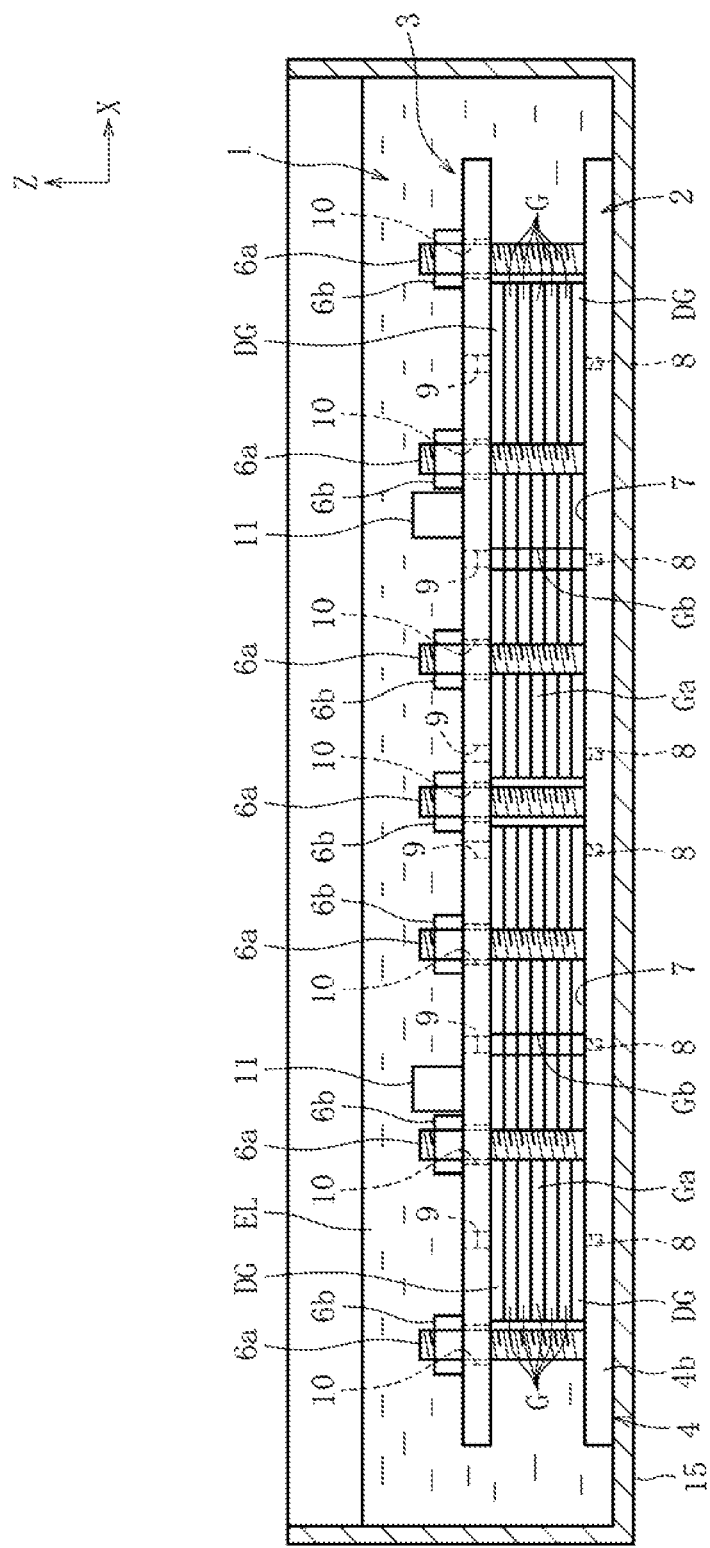
FIG. 13 is a side view for illustrating one step in the method of manufacturing a glass sheet.

After that, the operator grips the gripping portion 11 by hand to lift the holder 1 and immerses the holder 1 in an etching tank 15 storing an etchant EL (see FIG. 13). As the etchant EL, for example, a mixed acid containing hydrofluoric acid and hydrochloric acid may be used, but the present invention is not limited thereto. The peripheral edge portion Ga and the cutout portion Gb of each of the glass sheets G held by the holder 1 while being laminated are subjected to etching in the etching tank 15.

After etching is performed for a predetermined time period, the holder 1 is pulled up from the etching tank 15. The plurality of glass sheets G held by the holder 1 are removed from the holder 1, and then each surface of the glass sheets G is subjected to polishing for finishing. After that, the glass sheets G each having the cutout portion Gb subjected to etching is completed through a cleaning step. A main surface of the completed glass sheet G is a non-etched surface, and an etched surface is formed on the cutout portion Gb and the peripheral edge portion G excluding the cutout portion Gb.

In a method of manufacturing the glass sheet G according to the present invention described above, the strength of the glass sheet G can be improved by subjecting the cutout portion Gb to etching to completely subject the entire region of the cutout portion Gb to stable processing. Thus, the durability and longevity of the glass sheet G (cutout portion Gb) can be significantly improved. Further, etching is performed under a state in which the plurality of glass sheets G are held by the holder 1 while being laminated, and hence the treatment can be efficiently performed.

When each of the cutout portions Gb of the laminated plurality of glass sheets G is aligned at the same position by the first positioning pin 5a, each of the glass sheets G is laminated without exposing the surface thereof, and the surface of the glass sheet G is not brought into contact with the etchant EL during etching. Further, through formation of the protective layer 14 between the glass sheets G, the surface of each of the glass sheets G is not corroded with the etchant EL, and only the peripheral edge portion Ga comprising the cutout portion Gb is subjected to etching.

The plurality of bar-shaped members 6a of the coupling portion 6 provided to the first member 2 are arranged annularly so as to surround the periphery of the laminated glass sheets G. Therefore, when the second member 3 is coupled to the first member 2 with the coupling portion 6 (bar-shaped members 6a and nuts 6b), an appropriate pressure force can be uniformly applied to the plurality of glass sheets G arranged to be laminated. With this, each of the glass sheets G is held by the holder 1 without being displaced in position even after each of the positioning pins 5a to 5c is removed.

EXAMPLES

The inventor of the present invention conducted a test for confirming the effects of the present invention. In this test, a glass sheet obtained by polishing a cutout portion through use of a diamond tool was defined as Comparative Example 1. A glass sheet obtained by polishing a cutout portion with a polishing tape was defined as Comparative Example 2. A glass sheet obtained by subjecting a cutout portion to etching was defined as Example. A four-point bending strength test was conducted for Comparative Example 1, Comparative Example 2, and Example, and strengths obtained by the test were compared.

The test was conducted through use of a glass sheet having a diameter of 300 mm and a thickness of 1.0 m, with a loading point interval of 100 mm, a fulcrum interval of 200 mm, and a crosshead speed of 5.0 mm/min. In this test, an average value (average strength), a maximum value (maximum strength), and a minimum value (minimum strength) of bending strength were measured in each example, and the results were compared. The number of test bodies (number of test points) was 41 in Comparative Example 1, 45 in Comparative Example 2, and 46 in Example. The test results are shown in Table 1.

TABLE 1

|  | Average strength (N) | Maximum strength (N) | Minimum strength (N) | Number of test points |
| --- | --- | --- | --- | --- |
| Comparative Example 1 | 180 | 230 | 95 | 41 |
| Comparative Example 2 | 175 | 220 | 120 | 45 |
| Example | 235 | 335 | 145 | 46 |

As shown in Table 1, the test results of Example were larger in all of average value, maximum value, and minimum value of bending strength than those of Comparative Example 1 and Comparative Example 2.

The present invention is not limited to the configuration of the above-mentioned embodiment. In addition, the action and effect of the present invention are not limited to those described above. The present invention may be modified in various forms within the range not departing from the spirit of the present invention.

In the above-mentioned embodiment, there is illustrated an example in which each of the positioning pins 5a to 5c is supported by the hole 8 formed in the support surface 7 of the first member 2, but the present invention is not limited thereto. Grooves for movably (slidably) supporting the positioning pins 5a to 5c along the support surface 7 may be formed in the support surface 7 instead of the holes 8.

The grooves may be formed so that the positioning pins 5a to 5c can be changed between a first position for positioning the glass sheets G and a second position for retracting the glass sheets G from the first position. With this, when the glass sheets G are positioned with the positioning pins 5a to 5c at the first position, and then each of the positioning pins 5a to 5c is moved to the second position, each of the positioning pins 5a to 5c is not brought into contact with the glass sheet G, and the glass sheets G can be subjected to satisfactory etching.

Further, the cutout portions Gb may be aligned with each other by stacking a predetermined number of the glass sheets G on the support surface 7 of the first member 2, and then bringing a positioning member (positioning pin 5a) held by the operator by hand into abutment against the cutout portions Gb of the glass sheets G, without forming the holes 8 or the grooves.

In the above-mentioned embodiment, the positioning pins 5a to 5c are exemplified as the positioning portion 5, but the present invention is not limited thereto. The positioning portion 5 encompasses a plate member or other positioning members in accordance with the size of the glass sheet G and the cutout portion Gb.

In the above-mentioned embodiment, there is illustrated an example in which the protective layer 14 of the liquid L is formed between the glass sheets G, but the present invention is not limited thereto. The protective layer 14 may be formed of a sealing material or an adhesive having viscosity, the dummy glass DG, or other solids. Further, depending on the dimension, shape, strength, and the like of the glass sheet G, the glass sheet G can be laminated without forming the protective layer 14, and the cutout portion Gb can be subjected to etching.

In the above-mentioned embodiment, a notch is exemplified as the cutout portion Gb, but the present invention is not limited thereto. When the cutout portion Gb having a linear shape called "orientation flat" is formed in a semiconductor wafer, the cutout portion Gb having a linear shape may be correspondingly formed in the glass sheet G.

In the above-mentioned embodiment, there is illustrated an example in which the glass sheets G are stacked on the support surface 7 of the first member 2 arranged in an inclined state, but the present invention is not limited thereto. The support surface 7 may support the glass sheets G under a state of being horizontally arranged. Alternatively, the plurality of glass sheets G may be interposed between the support surface 7 arranged along a vertical direction and the second member 3 arranged so as to be opposed to the support surface 7.

In the above-mentioned embodiment, there is illustrated an example in which the glass sheets G arranged in a laminated state is held by the holder 1, and the holder 1 is immersed in the etching tank 15, but the present invention is not limited thereto. The plurality of glass sheets G may be arranged to be laminated at a predetermined position without using the holder 1, and the etchant may be applied or sprayed to the cutout portions Gb, to thereby subject only the cutout portions Gb to etching. In this case, the glass sheets G may be subjected to etching one by one without being laminated. Further, in this case, the peripheral edge portion Ga as well as the cutout portion Gb may be subjected to etching.

In the above-mentioned embodiment, there is illustrated an example in which each step of stacking (laminating) the glass sheets G on the first member 2, forming the protective layer 14 between the glass sheets G, overlaying the second member 3 on the first member 2, fastening the nuts 6b with respect to the bar-shaped members 6a of the coupling portion 6, and immersing the holder 1 in the etching tank 15 is performed manually by the operator, but the present invention is not limited thereto. Those steps may be automated to manufacture the glass sheet G.

REFERENCE SIGNS LIST 2 first member (stacking base)
5a first positioning pin (positioning member)
7 supporting surface
14 protective layer
G glass sheet
Ga peripheral edge portion
Gb cutout portion

The invention claimed is:

1. A method of manufacturing a glass sheet having a disc shape comprising a cutout portion in a peripheral edge portion, the method comprising:
   laminating a plurality of the glass sheets with positions of the cutout portions being aligned with each other; and
   etching the cutout portions,
   wherein the positions of the cutout portions of the plurality of glass sheets are aligned through use of a positioning member,
   wherein the positioning member aligns the positions of the cutout portions by contacting with the cutout portions, and
   wherein the positioning member is removably or movably mounted on a stacking base on which the plurality of glass sheets are to be stacked.

2. The method of manufacturing a glass sheet according to claim 1,
   wherein the stacking base has a support surface on which the plurality of glass sheets are to be stacked, and
   wherein the support surface is arranged in an inclined state with respect to a horizontal direction.

3. The method of manufacturing a glass sheet according to claim 1, wherein a protective layer is formed between the plurality of glass sheets.

4. The method of manufacturing a glass sheet according to claim 3, wherein the protective layer is formed of a liquid.

5. The method of manufacturing a glass sheet according to claim 1, wherein the cutout portions of the plurality of glass sheets and the peripheral edge portions of the plurality of glass sheets excluding the cutout portions are subjected to etching.

* * * * *